(12) United States Patent
Nishida

(10) Patent No.: US 6,388,515 B1
(45) Date of Patent: May 14, 2002

(54) FEEDFORWARD AMPLIFIER

(75) Inventor: Masakazu Nishida, Tokyo (JP)

(73) Assignee: NEC Corporation, Tokyo (JP)

( * ) Notice: Subject to any disclaimer, the term of this patent is extended or adjusted under 35 U.S.C. 154(b) by 13 days.

(21) Appl. No.: 09/703,733

(22) Filed: Nov. 2, 2000

(30) Foreign Application Priority Data

Nov. 5, 1999 (JP) .......................................... 11-314952

(51) Int. Cl.[7] ................................................ H03F 3/66
(52) U.S. Cl. ........................................ 330/52; 330/151
(58) Field of Search ............................. 330/52; 11/151

(56) References Cited

U.S. PATENT DOCUMENTS 5,565,814 A * 10/1996 Fukuchi ....................... 330/52
6,148,185 A * 11/2000 Maruyama et al. ......... 455/115
6,208,204 B1 * 3/2001 Suzuki et al. .................. 330/52

FOREIGN PATENT DOCUMENTS

JP          6-244647          9/1994

* cited by examiner

Primary Examiner—Michael B Shingleton
(74) Attorney, Agent, or Firm—Sughrue Mion, PLLC

(57) ABSTRACT

In a feedforward amplifier with a simplified circuit configuration, leakage signals are prevented between output terminals of a pilot oscillator and between input terminals of a detector circuit to remove distorted signals with almost ideal improvement. Each of an output change-over section of the pilot oscillator and an input change-over section of the detector includes a multistage change-over switch or an isolator, the pilot oscillator and the detector being shared between a distortion detecting loop and a distortion removing loop.

26 Claims, 13 Drawing Sheets

F I G. 6A
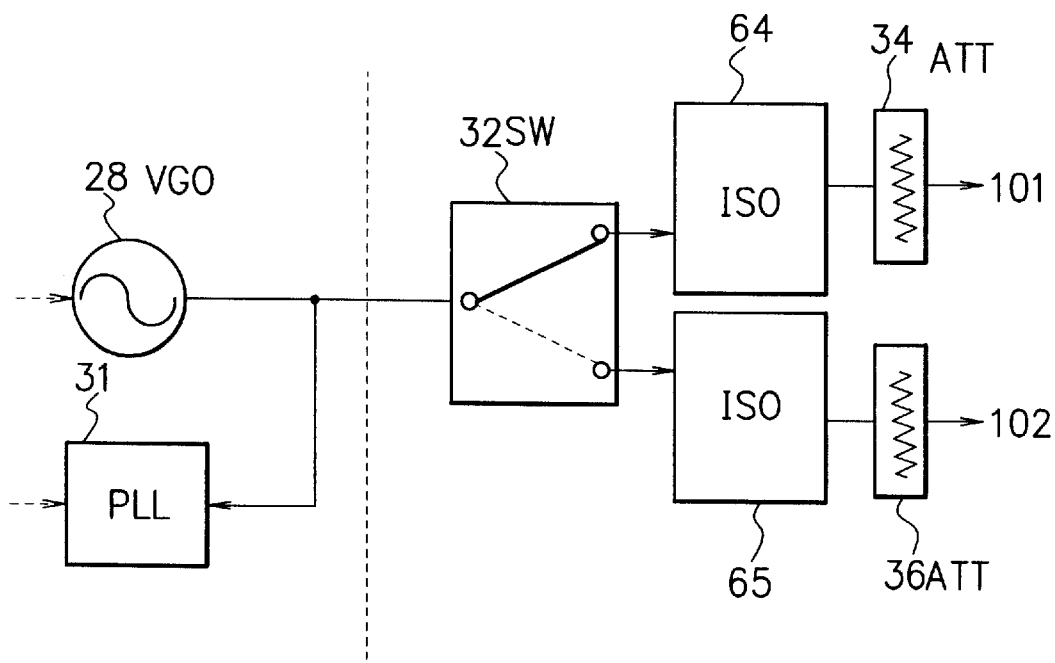
F I G. 6B
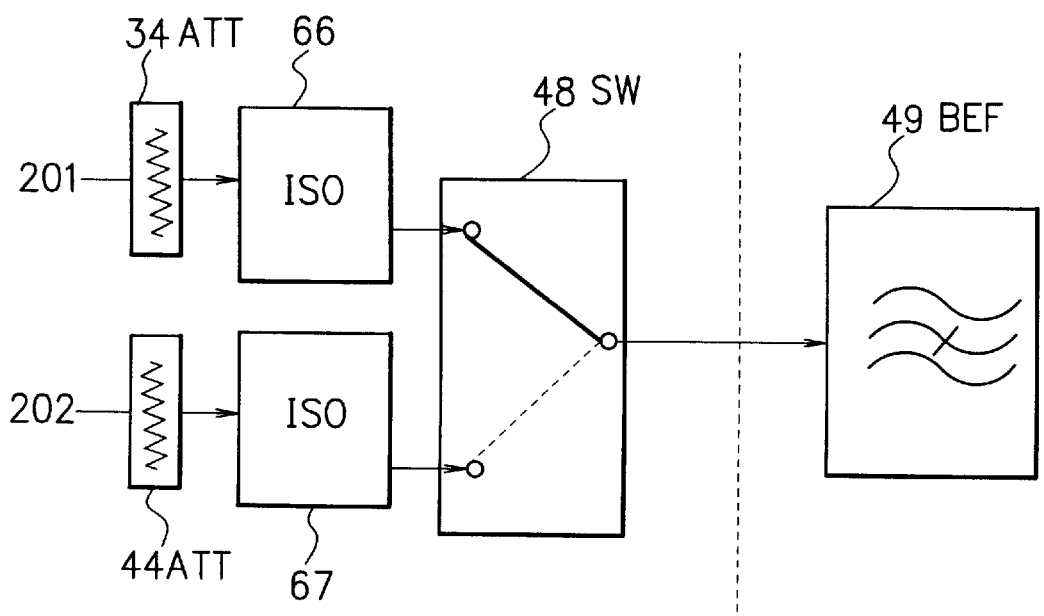

FIG. 7
(1)
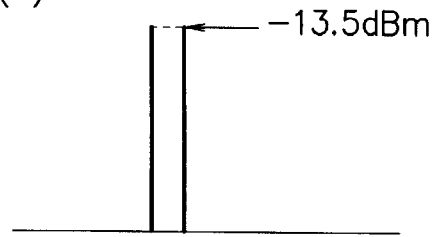
(2)
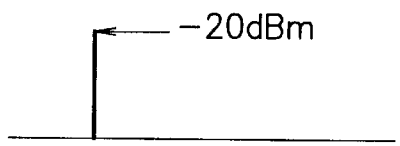
(3)
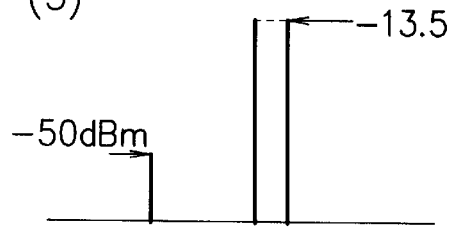
(4),(5)
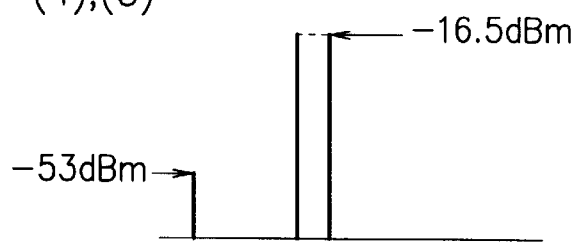
(6)
(7)
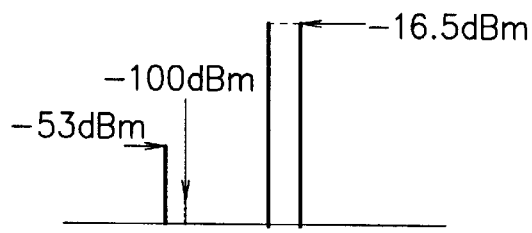

FIG. 9
(13)
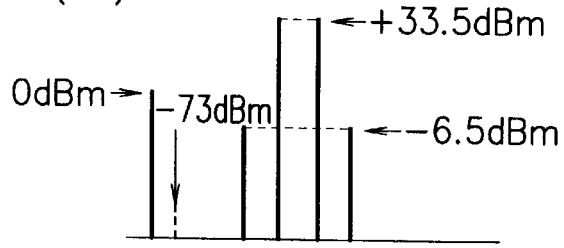
(16)
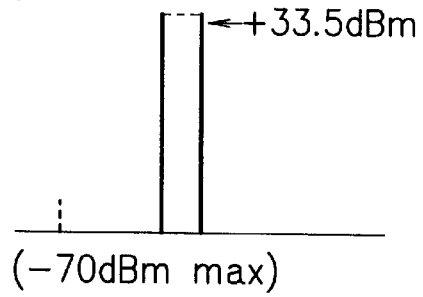
(14)
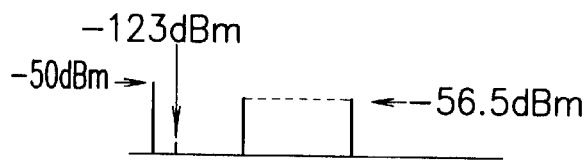
(17)
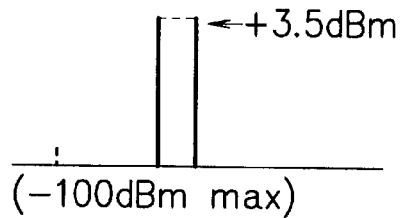
(15)
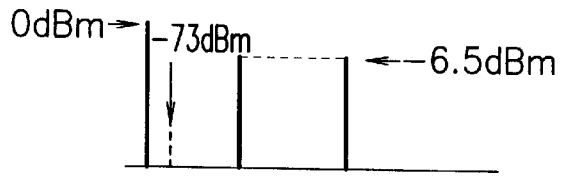

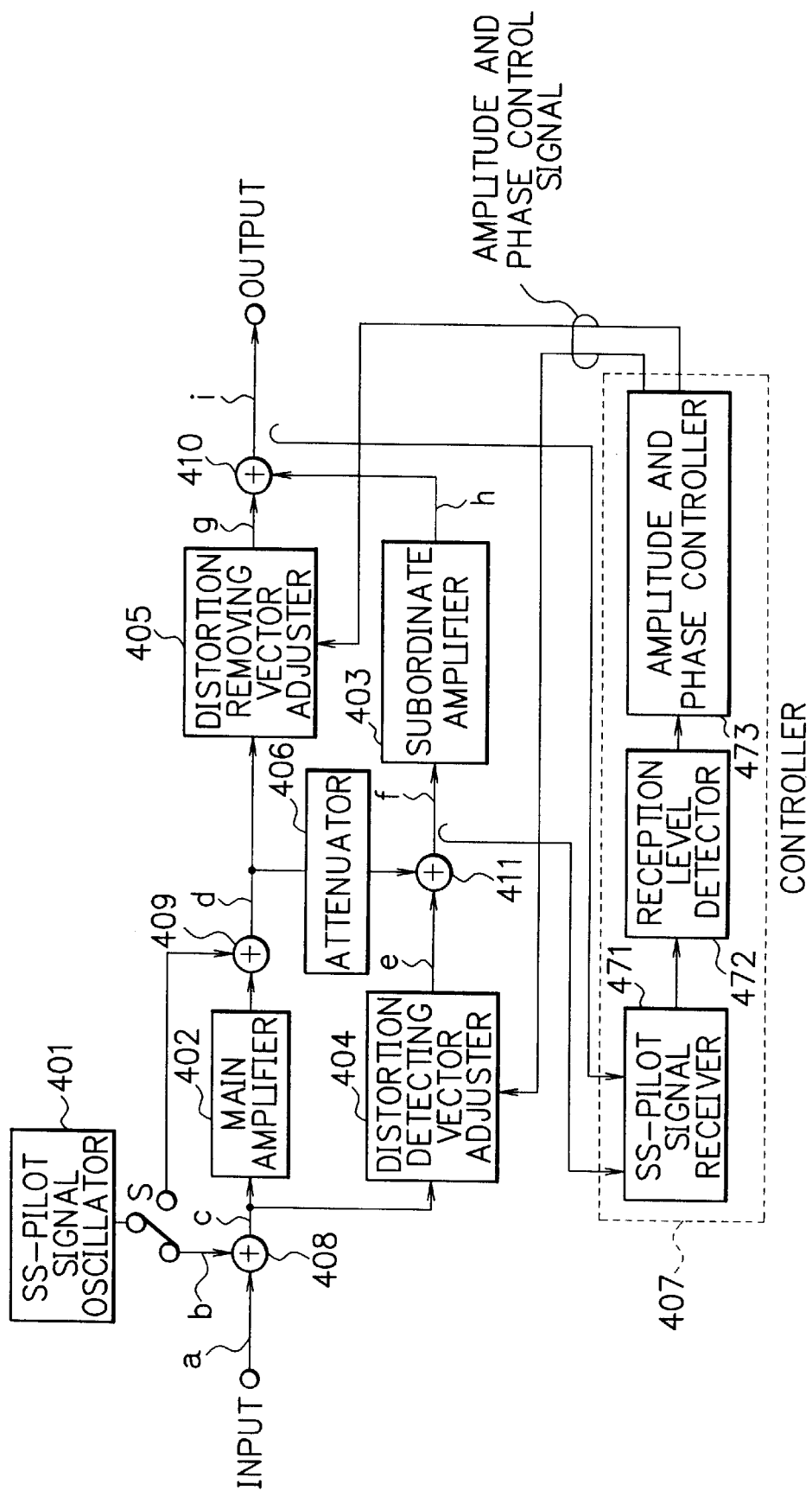

FEEDFORWARD AMPLIFIER

BACKGROUND OF THE INVENTION

The present invention relates to a feedforward amplifier in which distortion occurring when a multifrequency multiplexed signal of a high frequency band is amplified is suppressed to produce only a main amplified signal.

DESCRIPTION OF THE PRIOR ART

For feedforward amplifiers, various circuit configurations have been proposed, but the configurations become complex, which has soared the production cost of the amplifier. FIG. 12 shows a circuit layout example of a feedforward amplifier of the prior art.

The feedforward amplifier of FIG. 12 includes a distortion detecting loop A and a distortion removing loop B. In the loop A, an input signal from an input terminal 301 is a multifrequency multiplexed signal of a high frequency band. The input signal is simultaneously amplified by a main amplifier 304. A nonlinear distorted signal component resultant from the amplification by the main amplifier 304 is detected by canceling the amplified input signal components. In the distortion removing loop B, the distorted signal component detected by the loop A is amplified by a subordinate amplifier 315. The amplified signal is mixed with an output signal which includes a distorted signal component and which is outputted from the main amplifier 304. This cancels the distorted signal component in the output signal from the main amplifier 304 to obtain only the amplified input signal component.

The distortion detecting loop A includes a directional coupler 319, a two-output distributor 302, a vector adjuster 303, a main amplifier 304, a delay line 306, a controller 309, and a detector circuit 322. The loop A further includes couplers 307 and 308, which are shared between the loops A and B.

Operation of the distortion detecting loop A will be described. The directional coupler 319 mixes the multifrequency multiplexed signal received from the input terminal 301 with a single-frequency pilot signal. The mixed signal is distributed by the two-output distributor 302 as a first output and a second output. The first output is delivered via the vector adjuster 303 to the main amplifier 304, which resultantly produces an output signal. The coupler 308 mixes a part of the output signal with the second output signal which is outputted from the two-output distributor 302 and which has passed the delay line 306. These signals having mutually opposite phases.

The detector circuit 322 detects the pilot signal in the mixed signal. To minimize a signal level of the pilot signal component from the detector circuit 322, the controller 309 controls the vector adjuster 303 to adjust quantity or values of attenuation and phase. When the controller 309 appropriately controls the vector adjuster 303, the coupler 308 outputs only the distorted signal resultant from the amplification of the main amplifier 304.

Description will now be given of operation of the distortion removing loop B. In the coupler 312, the distorted signal detected by the distortion detecting loop A is received as a first input via the vector adjuster 313 and the subordinate amplifier 315. The coupler 312 receives as a second input the output signal from the main amplifier 304 delayed through the delay line for a propagation delay time of the vector adjuster 313 and the subordinate amplifier 315. The first and second input signals have opposite phases.

The coupler 912 mixes these signals with each other and feeds a resultant mixed signal to a coupler 316. The coupler 316 delivers a part of the mixed signal to a detector circuit 323. The detector circuit 323 detects a pilot signal component of the input signal and outputs the pilot signal component to a controller 314. To minimize a level of the pilot signal component, the controller 314 controls the vector adjuster 313 to adjust quantity of attenuation and phase. Therefore, when the controller 314 controls the vector adjuster 313 in an appropriate manner, the coupler 316 outputs only the input signal component amplified by the main amplifier 304.

To implement the function, each of the distortion detecting loop A and the distortion removing loop B of the feedforward amplifier of the prior art includes a pilot oscillator (318, 320) a controller (309, 314) and a detector circuit (322, 323).

However, the feedforward amplifier of this configuration requires a large number of elements and hence a high production cost. Consequently, various feedforward amplifiers of a simplified circuit configuration have been proposed.

Japanese Patent Laid-Open Publication No. Heisei 6-244647 describes an example of a feedforward amplifier of the prior art. As shown in FIG. 13, the feedforward amplifier includes a switching unit S at an output terminal of a spread spectrum (SS) pilot signal oscillator 401 to deliver pilot signals to couplers 408 and 409. Namely, the pilot signal oscillator 401 is shared between a distortion detecting loop and a distortion removing loop.

The feedforward amplifier further includes a controller 407 to receive output signals respectively from couplers 411 and 410. The controller 407 receives a pilot signal component in a mixed signal from the coupler 411 and a pilot signal component in a mixed signal from the coupler 410. To minimize a reception level of each of the pilot signal components, the controller 407 controls a distortion detecting vector adjuster 404 and a distortion removing vector adjuster to adjust magnitude of amplitude and phase.

In the feedforward amplifier of the prior art, the distortion detecting loop and the distortion removing loop share the pilot signal oscillator 401 and the controller 407. To achieve the function of the feedforward amplifier shown in FIG. 13, this amplifier is more simplified in the circuit configuration when compared with that of FIG. 12.

In the feedforward amplifier configured as shown in FIG. 13, the pilot signal oscillator and the controller are shared between the distortion detecting loop and the distortion removing loop. Therefore, the feedforward amplifier includes two output terminals to deliver pilot signals from the pilot signal oscillator, and the controller includes two input terminals to receive mixed signals.

When the pilot signal oscillator 401 outputs a pilot signal from a first output terminal, a leakage signal of the pilot signal appears on a second output terminal of the oscillator 401. When a mixed signal is delivered to a first input terminal of the controller 407, a leakage signal of the mixed signal takes place on a second input terminal of the controller 407.

Consequently, the mixed signal propagating through the circuit includes an inherent pilot signal component and a leakage pilot signal component having a frequency equal to that of the inherent pilot signal component. The controller detects both of these signals to control the vector adjusters 404 and 405. This naturally leads to a control error.

In this connection, the feedforward amplifier of the prior art shown in FIG. 13 includes a spread spectrum (SS) pilot signal. Therefore, the control error due to the signal leakage between two output terminals and between two in t terminals is small enough for the controller 407 to appropriately control the distortion detecting vector adjuster 404 and the distortion removing vector adjuster 405.

However, when the single frequency pilot signal described in conjunction with FIG. 12 is applied in place of the spectrum spread pilot signal to the feedforward amplifier in which the distortion detecting loop and the distortion removing loop share the pilot signal oscillator and the controller as shown in FIG. 13, the control error in the adjustment of the quantity of attenuation and phase in the vector adjusters becomes greater when compared with a case in which the spectrum spread (SS) pilot signal is employed. Consequently, there arises a problem of insufficient improvement in the removal of the distorted signal. This problem is not taken into consideration in the prior art shown in FIG. 13.

SUMMARY OF THE INVENTION

It is therefore an object of the present invention to provide a feedforward amplifier with a simplified configuration to share a pilot signal oscillator and a controller between a distortion detecting loop and a distortion removing loop. In the feedforward amplifier, two output terminals for the pilot signal oscillator are sufficiently isolated from each other as well as tow input terminals of the controller are also fully isolated from each other. This suppresses the signal leakage between two output terminals and between two input terminals and hence leads to satisfactory improvement sufficient to remove the distorted signal.

In accordance with first aspect of the present invention, there is provided to achieve the object above, a feedforward amplifier, comprising:

a main amplifier, a distortion detecting loop for detecting a nonlinear distorted signal component appearing due to amplification of a multifrequency input signal by said main amplifier and a distortion removing loop for removing a distorted signal component from the multifrequency input signal amplified by said main amplifier, according to the distorted signal component detected by said distortion detecting loop;

a pilot signal oscillating means for alternately outputting a pilot signal for a detecting operation of a distorted signal component of said distortion detecting loop and a removing operation of a distorted signal component of said distortion removing loop; and a detecting means for alternately receiving mixed signals from said distortion detecting loop and said distortion removing loop and detecting a pilot signal component in the mixed signals received from said loops, wherein:

said pilot signal oscillating means includes output change-over means for outputting the pilot signal to either one of said distortion detecting loop and said distortion removing loop, said output change-over means including a multistage change-over switch; and said detecting means includes input change-over means for receiving the mixed signal from either one of said distortion detecting loop and said distortion removing loop, said input change-over means including a multi-stage change-over switch.

In accordance with second aspect of the present invention, there is provided to a feedforward amplifier, comprising:

a main amplifier, a distortion detecting loop for detecting a nonlinear distorted signal component appearing due to amplification of a multifrequency input signal by a main amplifier and a distortion removing loop for removing a distorted signal component from the multifrequency input signal amplified by said main amplifier, according to the distorted signal component detected by said distortion detecting loop;

a pilot signal oscillating means for alternately outputting a pilot signal for a detecting operation of a distorted signal component of said distortion detecting loop and a removing operation of a distorted signal component of said distortion removing loop; and a detecting means for alternately receiving mixed signals from said distortion detecting loop and said distortion removing loop and detecting a pilot signal component in the mixed signals received from said loops, wherein:

said pilot signal oscillating means includes output change-over means for outputting the pilot signal to either one of said distortion detecting loop and said distortion removing loop, said output change-over means including a multistage change-over switch;

said detecting means includes input change-over means for receiving the mixed signal from either one of said distortion detecting loop and said distortion removing loop, said input change-over means including a multi-stage change-over switch and;

said output change-over means comprises:

a first change-over switch for connecting the pilot signal to either one of two output terminals;

at least one stage of a second change-over switch disposed for each pair of two output terminals of said first change-over switch for connecting the pilot signal delivered from said first change-over switch to an input of a change-over switch in a succeeding stage or to ground; and a third change-over switch disposed for each pair of two output terminals of said second change-over switch for connecting the pilot signal fed from said second change-over switch to an output terminal of said pilot signal oscillating means or to ground.

In accordance with third aspect of the present invention, there is provided to a feedforward amplifier, comprising a main amplifier, a distortion detecting loop for detecting a nonlinear distorted signal component appearing due to amplification of a multifrequency input signal by a main amplifier and a distortion removing loop for removing a distorted signal component from the multifrequency input signal amplified by said main amplifier, according to the distorted signal component detected by said distortion detecting loop;

a pilot signal oscillating means for alternately outputting a pilot signal for a detecting operation of a distorted signal component of said distortion detecting loop and a removing operation of a distorted signal component of said distortion removing loop; and a detecting means for alternately receiving mixed signals from said distortion detecting loop and said distortion removing loop and detecting a pilot signal component in the mixed signals received from said loops, wherein:

said pilot signal oscillating means includes output change-over means for outputting the pilot signal to either one of said distortion detecting loop and said distortion removing loop, said output change-over means including a multistage change-over switch;

said detecting means includes input change-over means for receiving the mixed signal from either one of said distortion detecting loop and said distortion removing loop, said input change-over means including a multi-stage change-over switch; and said output change-over means comprises:

a change-over switch in a preceding stage for connecting an output of the pilot signal to either one of two output terminals; and a change-over switch in a succeeding stage disposed for each pair of the two output terminals of said second change-over switch in the preceding stage for connecting the pilot signal outputted from the change-over switch in the preceding stage to an output terminal of said pilot signal oscillating means or to ground.

In the first to third aspects of the present invention, said input change-over means comprises:

first change-over switch in a preceding stage disposed for each pair of two input terminals of said detecting means for connecting the input signal to an input terminal of a change-over switch in a preceding stage or to ground; and a second change-over switch disposed in a succeeding stage of said first change-over switch in the preceding stage for connecting one of outputs from said change-over switch in the preceding stage to an input terminal of said detecting means are preferable.

In the first to third aspects of the present invention, said input change-over means comprises:

first change-over switch disposed for each pair of two input terminals of said detecting means for connecting the signal inputted thereto to an input terminal of a change-over switch in a subsequent stage or to ground;

at least one stage of a second change-over switch disposed for each pair of two output terminals of said first change-over switch for connecting a signal inputted from said first change-over switch to an input of a change-over switch in a succeeding stage or to ground; and a third change-over switch for connecting either one of outputs from said second change-over switch to an input terminal of said detecting means are preferable.

In accordance with fourth aspect of the present invention, there is provided to a feedforward amplifier, comprising:

a main amplifier;

a distortion detecting loop for detecting a nonlinear distorted signal component appearing through amplification of a multifrequency input signal by said main amplifier;

a distortion removing loop for removing a distorted signal component from the multifrequency input signal amplified by said main amplifier, according to the distorted signal component detected by said distortion detecting loop;

pilot signal oscillating means for alternately outputting a pilot signal for a detecting operation of a distorted signal component of said distortion detecting loop and a removing operation of a distorted signal component of said distortion removing loop; and detecting means for alternately receiving a mixed signal from said distortion detecting loop and said distortion removing loop and detecting a pilot signal component in the mixed signal received from said loops, wherein:

said pilot signal oscillating means includes output change-over means for outputting the pilot signal to either one of said distortion detecting loop and said distortion removing loop;

said output change-over means is disposed for each pair of two output terminals of said pilot signal oscillating means and includes an isolator to guarantee isolation between the two output terminals and a change-over switch disposed in a stage preceding said isolator to connect an output of a pilot signal to either one of said isolators;

said detecting means includes input change-over means for receiving the mixed signal from either one of said distortion detecting loop and said distortion removing loop; and said input change-over means is disposed for each pair of two input terminals of said detecting means and includes an isolator to guarantee isolation between the two input terminals and a change-over switch disposed in a stage succeeding said isolator to connect an output from either one of said isolators to an input terminal of said detecting means.

In accordance with fifth aspect of the present invention, there is provided to a feedforward amplifier:

a directional coupler for mixing an input multifrequency multiplexed signal inputted thereto with a pilot signal received via a first output terminal of said output change-over means from said pilot signal oscillating means;

a two-output distributor for dividing the mixed signal into tow output signals;

a first vector adjuster for receiving the first output signal from said two-output distributor and for adjusting quantity of phase and quantity of attenuation of the first output signal;

a main amplifier for amplifying an output signal from said first vector adjuster;

a first coupler for separating a part of an amplified signal from said main amplifier and for outputting therefrom the signal separated from the amplified signal;

a first delay line for delaying propagation of a second output signal from said two-output distributor for a propagation time of a signal in said main amplifier and said first vector adjuster;

a second coupler for mixing a signal delayed by the first delay line with a signal received from said first coupler, the delayed signal having a phase opposite to that of the signal received from said first coupler;

a third coupler for separating a part of a mixed signal from said second coupler and for outputting therefrom the signal separated from the mixed signal;

a control circuit for receiving an output signal from said third coupler via a first input terminal of said input change-over means and for controlling quantity of phase and quantity of attenuation in said first vector adjuster, thereby minimizing a level of a pilot signal component detected in said output signal from said third coupler by said detecting means;

a fourth coupler for mixing, after the control operation is conducted for said first vector adjuster by said control circuit, a pilot signal received via a second output terminal of said output change-over means from said pilot signal oscillating means with an output signal from said first vector adjuster;

a second vector adjuster for receiving a signal obtained by mixing by said second coupler a part of a signal attained by amplifying by said main amplifier a mixed signal from said four coupler with a signal delayed by said delay line and received by said second coupler and for adjusting quantity of attenuation and quantity of phase of the signal from said second coupler;

a subordinate amplifier for amplifying an output signal from said second vector adjuster;

a second delay line for delaying propagation of a signal for which a pilot signal have been mixed by said four coupler and which has been outputted from said main amplifier for a propagation time of a signal in said second vector adjuster said subordinate amplifier;

a fifth coupler for mixing a signal delayed by said second delay line and received therefrom with a signal received from said subordinate amplifier, the delayed signal having a phase opposite to that of the signal from said subordinate amplifier, and for outputting a mixed signal resultant from the mixing to an output terminal; and a sixth coupler for separating a part of the signal fed to the output terminal and for outputting the separated signal therefrom, wherein:

said input change-over means receives the output signal from said sixth coupler via a second input terminal; and said control circuit adjusts quantity of attenuation and quantity of phase of said second vector adjuster to minimize a level of a pilot signal component detected by the detecting means in a signal received via a second input terminal.

In the first to fifth aspects of the present invention, said change-over switches include transfer switches are preferable.

In the first to fifth aspects of the present invention, said pilot signal oscillator means produces a pilot signal having a frequency of about 2 GHz.

In the first to fifth aspects of the present invention, said pilot signal is a signal having a single frequency.

BRIEF DESCRIPTION OF THE DRAWINGS

The objects and features of the present invention will become more apparent from the consideration of the following detailed description taken in conjunction with the accompanying drawings in which:

FIGS. 6A and 6B are diagrams showing further alternative embodiments of an output change-over unit of the pilot oscillator and an input change-over unit of the detector circuit;

FIG. 7 is a first power waveform graph for explaining operation of the first embodiment of the feedforward amplifier;

FIG. 9 is a third power waveform graph for explaining operation of the first embodiment of the feedforward amplifier;

FIG. 13 is a schematic block diagram showing a circuit layout of a second example of a feedforward amplifier of the prior art.

DESCRIPTION OF THE PREFERRED EMBODIMENTS

Referring next to the accompanying drawings, description will be given of embodiments in accordance with the present invention.

Figure 1:
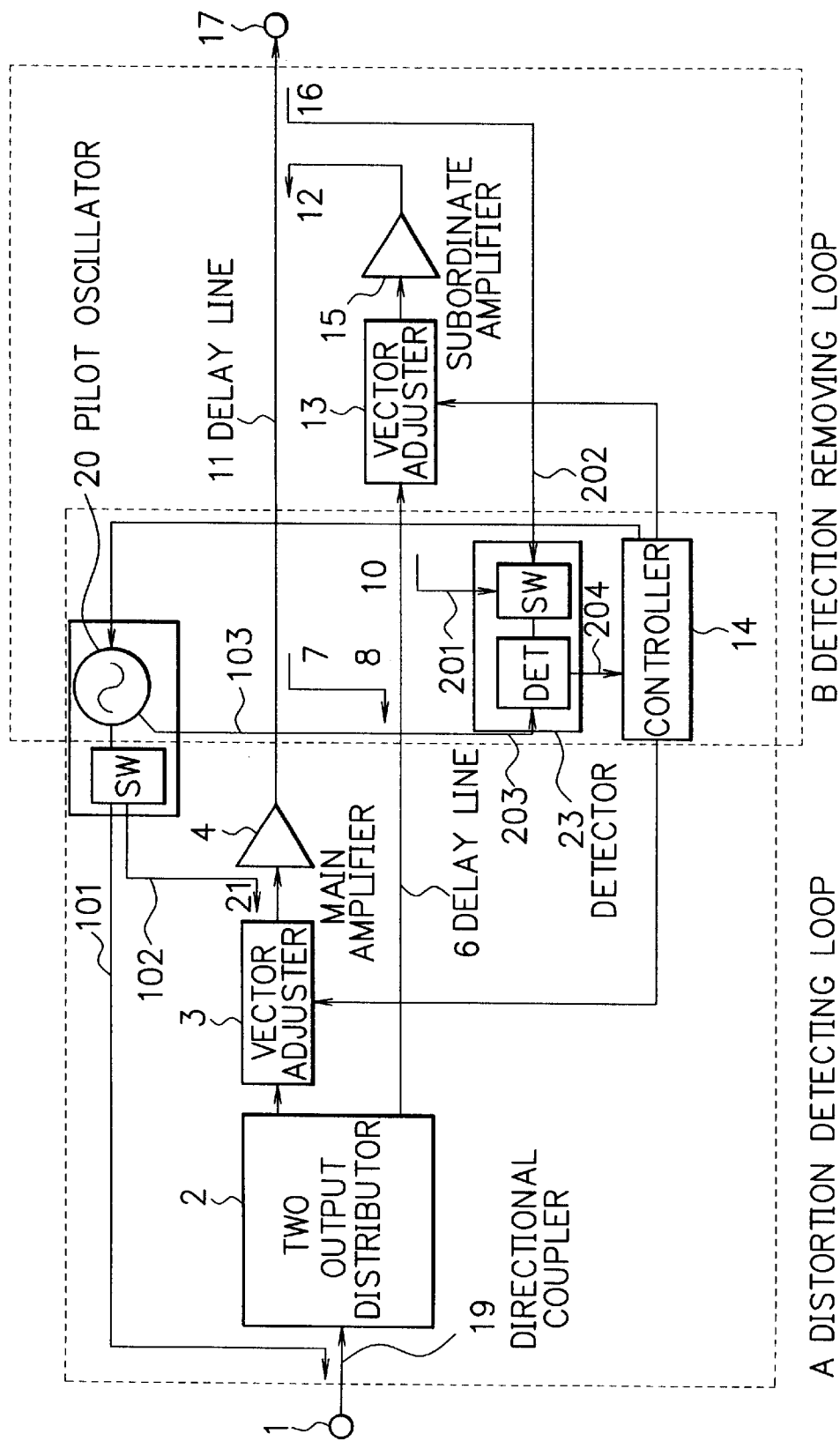
FIG. 1 is a schematic block diagram showing a circuit configuration of a first embodiment of a feedforward amplifier in accordance with the present invention.
Figure 12:
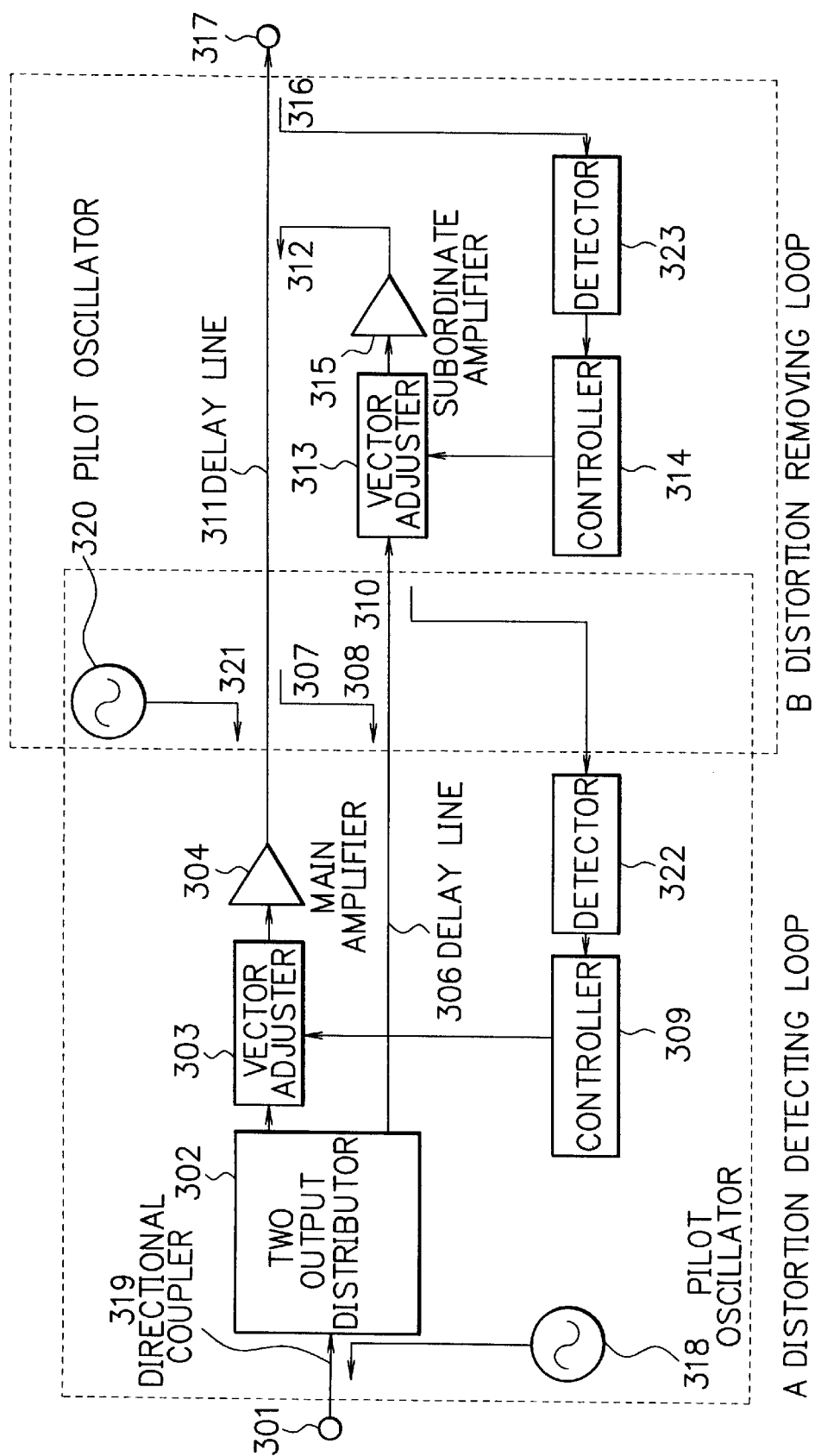
FIG. 12 is a block diagram showing a circuit configuration of a first example of a feedforward amplifier of the prior art.

FIG. 1 shows constitution of an embodiment of a feedforward amplifier in accordance with the present invention in a block diagram. Like the feedforward amplifier of the prior art shown in FIG. 12, the feedforward amplifier of FIG. 12 includes a distortion detecting loop A and a distortion removing loop B. In the distortion detecting loop A, a multifrequency multiplexed signal of a high frequency band is received by an input terminal 1 and is then simultaneously amplified by a main amplifier 4. By canceling the amplified input signal component, a nonlinear distorted signal component caused by the amplification of the main amplifier 4 is detected. In the distortion removing loop B, the distorted signal component detected by the distortion detecting loop A is amplified by a subordinate amplifier 15. Thereafter, by canceling a distorted signal component in an output signal from the main amplifier 4 (in a main amplified signal), there is obtained an output signal only including the amplified input signal component.

The distortion detecting loop A includes a directional coupler 19 to separate or to mix signals, a two-output distributor 2, a vector adjuster 3, a main amplifier 4, and a delay line 6 to delay a signal. The loop A further includes couplers 7, 8, and 10, a pilot oscillator 20, a detector circuit 23, and a controller 14. These components are shared between the loops A and B.

The distortion removing loop B includes a delay line 11, couplers 12 and 16, a vector adjuster 13, a subordinate amplifier 15, and the shared components (i.e., couplers 7, 8, and 10, a controller 14, a pilot oscillator 20, and a detector circuit 23).

Figure 2:
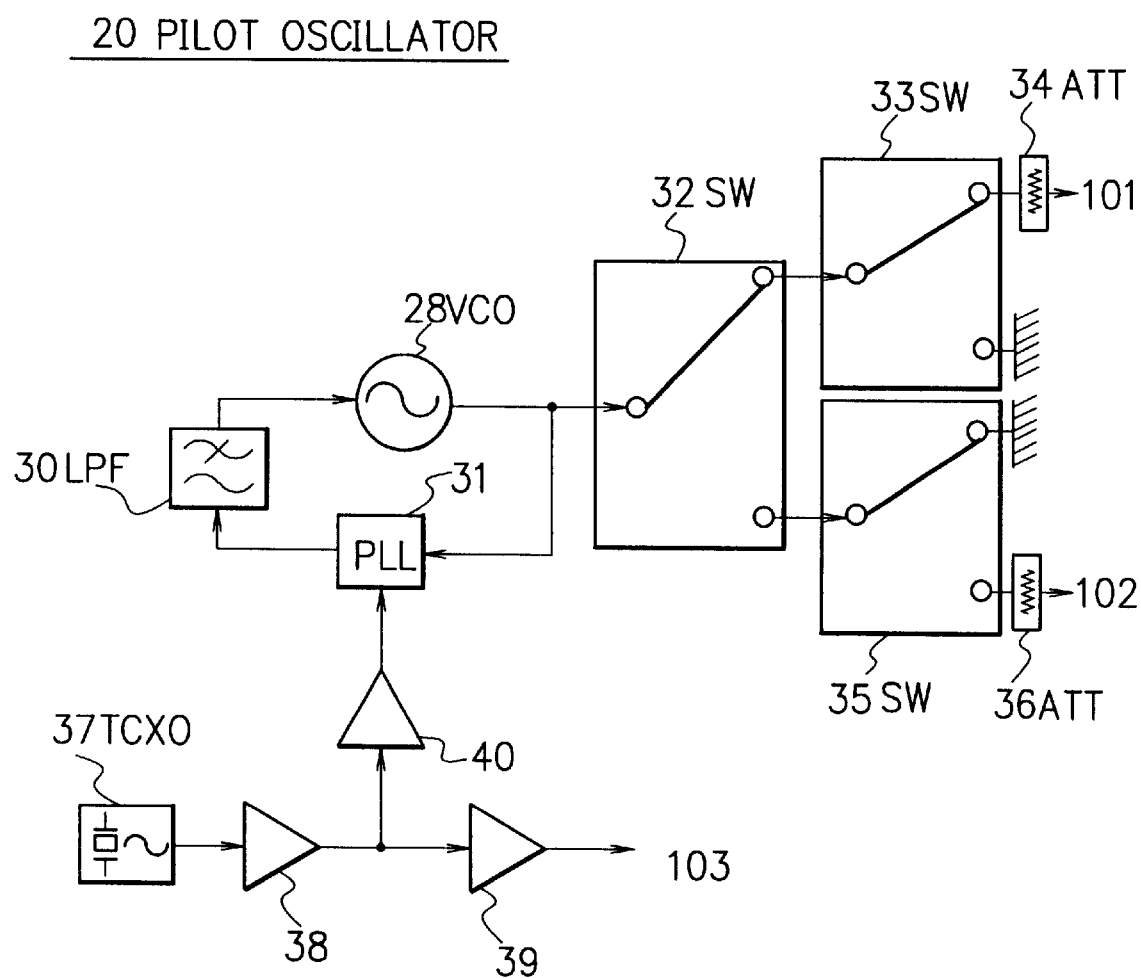
FIG. 2 is a diagram showing a circuit layout of a pilot oscillator in the first embodiment.

FIG. 2 shows in a block diagram a detailed configuration of the pilot oscillator in the embodiment. The oscillator includes a crystal oscillator TCXO 37 using crystal as an oscillating section. The oscillator 37 produces a clock signal with a frequency of about 10 megaherz (MHz). The clock signal is amplified by amplifies AMP 38 and 40 and is delivered to a phase-locked loop (PLL) circuit 31. The clock signal from the oscillator (TCXO) 37 has a stable frequency. The circuit 31 divides the clock signal by n (n is a positive integer other than zero) and compares the divided signal obtained by the division with an output signal from a voltage-controlled oscillator (VCO) 28.

The oscillator 28 varies a frequency of the clock signal in response to an external control voltage. The oscillator 20 further includes a low-pass filter (LPF) 30 having a constant. The constant of the filter 30 determines a loop band of the PLL circuit 31 and the low-pass filter 30 for the output signal from the oscillator 28. As above, the PLL circuit 31 compares the output signal from the oscillator 28 with a signal obtained by dividing the output signal from the oscillator 37 and feeds an external control voltage to the voltage-controlled oscillator 28 according to a result of the comparison. Therefore, the oscillator 28 produces a signal with a stable frequency, for example, 2070 MHz.

The VCO 28 outputs the pilot signal of the pilot oscillator 20 from an output terminal 101 or 102. To determine which one of the output terminals 101 and 102 is used to deliver the pilot signal, the controller 14 controls connections for switches 32, 33, and 35.

The pilot signal from the output terminal 101 is fed to the directional coupler 19. The pilot signal from the output terminal 102 is inputted to the directional coupler 21. Each of the couplers 19 and 21 has a predetermined input level for the input signal. Therefore, the pilot oscillator 20 includes attenuators (ATT) 34 and 36 in preceding stages of sections to output the respective pilot signals.

The pilot oscillator 20 further includes an output terminal 103. The clock signal from the oscillator 37 is fed via the amplifier 38 to the amplifier 39, and an amplified signal from the amplifier 39 is delivered to the output terminal 103. The clock signal thus outputted from the output terminal 103 is fed to an input terminal 203 of the detector circuit 23 and is used as an input clock signal of the PLL circuit 43.

Figure 5A:
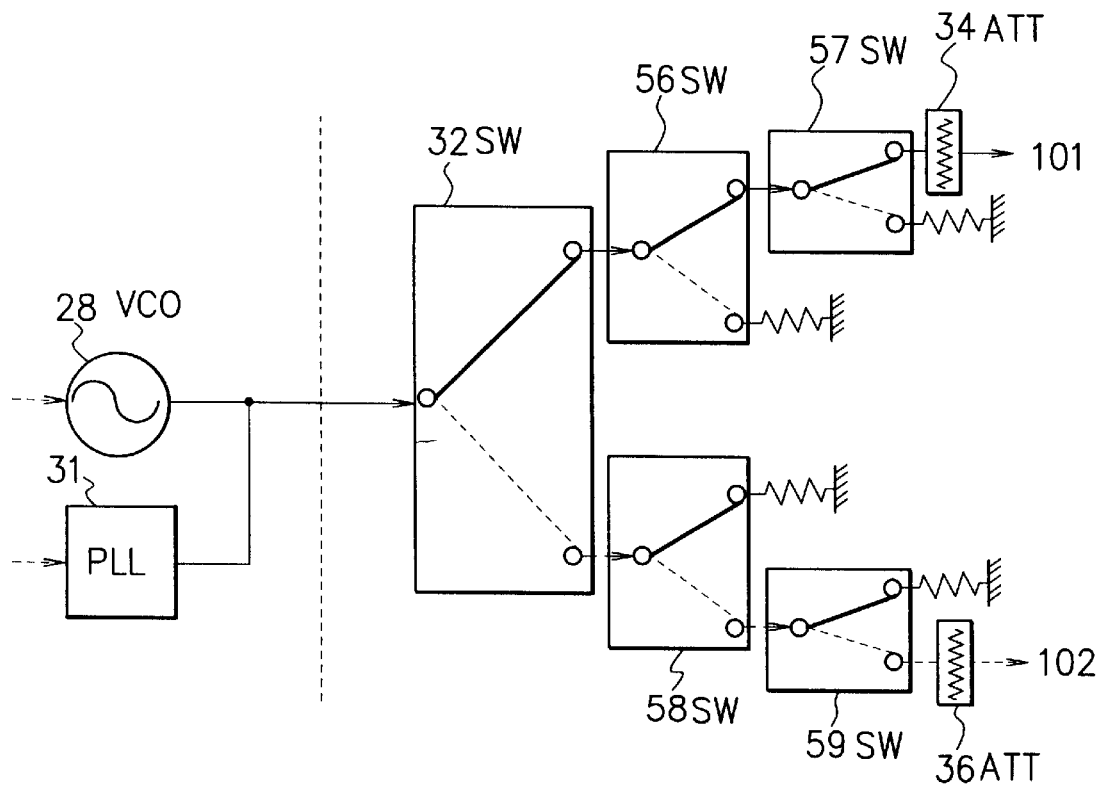
FIGS. 5A and 5B are diagrams showing alternative embodiments of an output change-over unit of the pilot oscillator and an input change-over unit of the detector circuit.

In the construction of the pilot oscillator 20 shown in FIG. 2, the change-over switches are configured in two stages to guarantee isolation between the output terminals 101 and 102. In the pilot oscillator 20 used the present invention, the change-over switches (56 to 59) may be configured in a multistage layout (three stages in this case) as shown in FIG. 5A. Alternatively, in place of the switches 33 and 35 of FIG. 2, isolators 64 and 65 may be arranged in FIG. 6A. In the structure using the change-over switches in multiple stages, when the number of stages is increased, the output terminal 101 is much more isolated from the output terminal 102 in the pilot oscillator 20.

Figure 3:
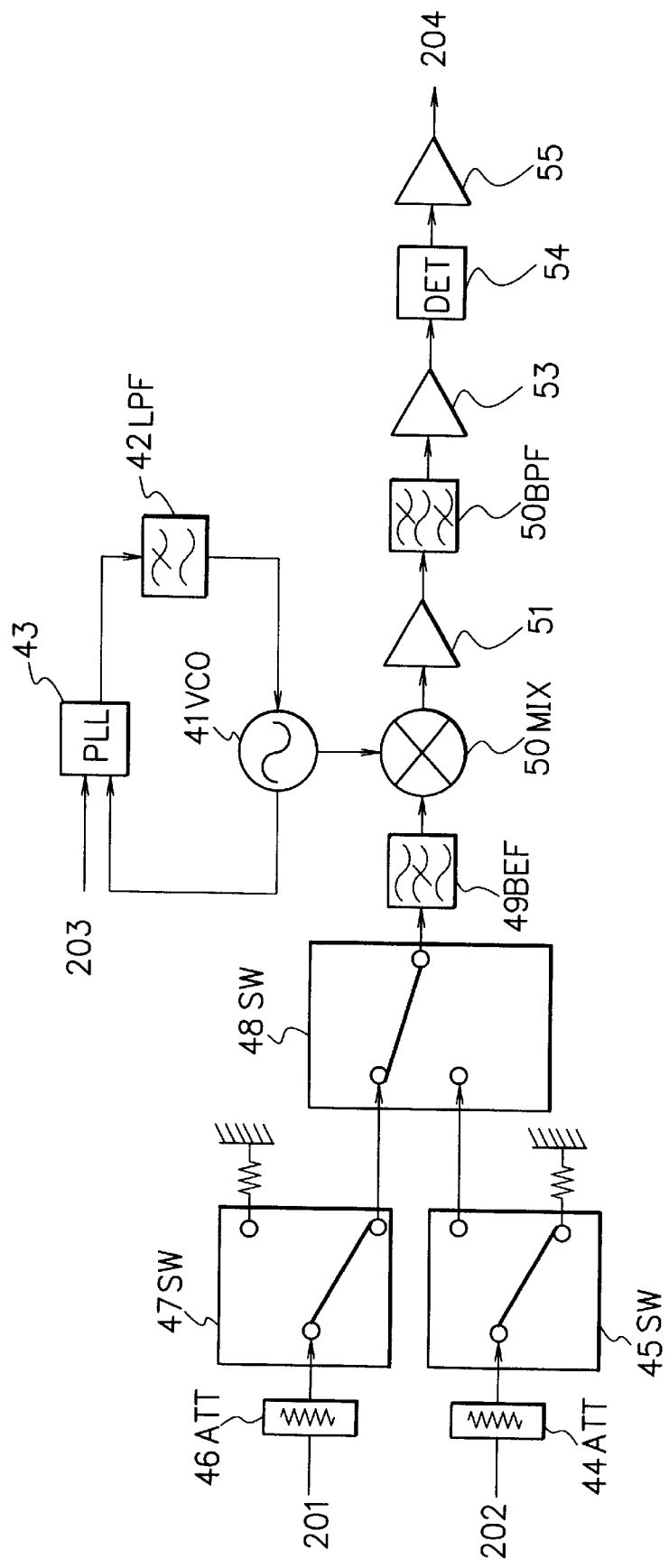
FIG. 3 is a diagram showing a circuit configuration of a detector circuit in the first embodiment.
Figure 4:
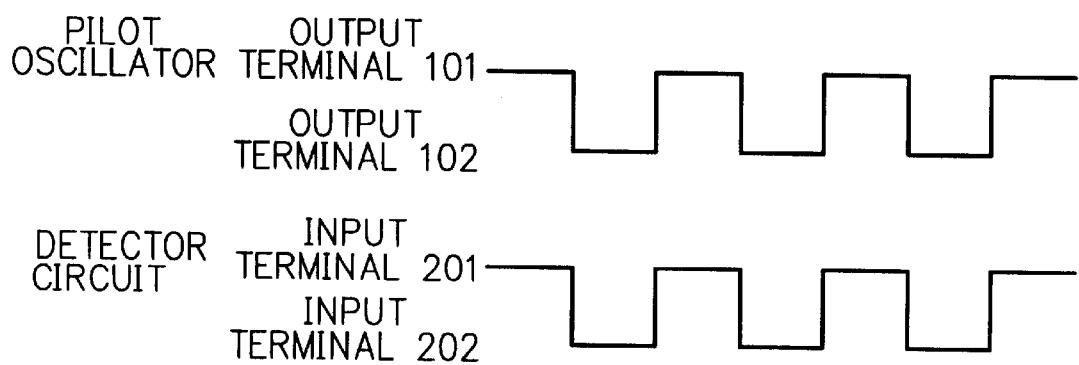
FIG. 4 is a diagram showing waveforms of signals outputted from a pilot oscillator and signals inputted to a detector circuit under control of a control circuit in the first embodiment.

FIG. 3 shows in a block diagram a detailed configuration of the detector circuit in the embodiment of the present invention. The clock signal from the output terminal 103 of the pilot oscillator 20 shown in FIG. 2 is fed via the input terminal 203 of the detector circuit 23 to a phase-locked loop circuit 43 and is divided therein.

The PLL circuit 43 includes another input terminal to receive an output signal from a voltage-controlled oscillator 41. The circuit 43 divides the input clock signal and then compares a divided signal resultant from the division with the signal from the oscillator 41 to deliver an external control voltage to the oscillator 41 according to a result of the comparison. Consequently, the oscillator 41 produces a signal (LO) having a stable frequency of, for example, 2059.3 MHz and outputs the signal to a frequency modulator (MIX) 50. The detector circuit 23 includes a low-pass filter (LPF) 42 having a predetermined constant. The constant determines a loop band of the PLL circuit 43 and the low-pass filter 42 for the output signal from the voltage-controlled oscillator 41.

The detector circuit 23 further includes input terminals 201 and 202. The signal from the coupler 10 of FIG. 1 is fed to the input terminal 201 and the signal from the coupler 16 of FIG. 1 is delivered to the input terminal 202. Before the input signals fed respectively from the input terminals 201 and 202 are delivered to the detector circuit 23, the signals are adjusted to respective appropriate input levels by the attenuators 46 and 44, respectively. Each of the signals is then fed to a band elimination filter (BEF) 49.

To input the signal from the input terminal 201 or 202 to the filter 49, the controller 14 selectively controls connections for switches 45, 47, and 48. The signal from the filter 49 is delivered as an RF signal to the frequency modulator (MIX) 50.

The band elimination filter 49 eliminates, from the signal received by the detector circuit 23, any signal beyond a predetermined frequency band of the pilot signal and feeds only the pilot signal as an RF signal to the frequency modulator (MIX) 50. Assume, for example, that the pilot signal has a frequency of 2070 Mhz and the input signal from the input terminal 1 and the distorted signal due to the amplification of the main amplifier are in a frequency band from 2110 MHz to 2130 MHz. The band elimination filter 49 passes only a signal having a frequency of about 2070 MHz, namely, only the pilot signal in this case. The signal is fed as an RF signal to the frequency modulator (MIX) 50. Namely, the band elimination filter 49 eliminates any input signals and any distorted signals having a frequency from 2110 MHz to 2130 MHz.

While the LO signal (2059.3 MHz in this case) is being received by the frequency modulator (MIX) 50, when an RF signal (2070 MHz in this case) is inputted to the frequency modulator 50, the modulator 50 produces an IF signal having a differential frequency between the LO signal and the RF signal (10.7 MHz in this case). The IF signal from the frequency modulator 50 is amplified by an amplifier 51 and is fed to a band-pass filter (BPF) 52. The filter 52 passes only a signal having a predetermined frequency band (10.7 MHz in this case) for operation in subsequent stages of the controller 14.

The signal having passed the filter 52 is amplified by an amplifier (AMP) 55 and is then converted into a direct-current (DC) signal by a detector circuit 54 to be outputted to an amplifier 55. The amplifier 55 amplifies the signal and feeds the amplified signal to an output terminal 204. The signal from the output terminal 204 is delivered to the controller 14 shown in FIG. 1. To minimize the level of the input pilot signal from the detector circuit 23 by the operation above, the controller 14 controls the vector adjusters 3 and 13 to adjust magnitude of attenuation and phase.

Figure 5B:
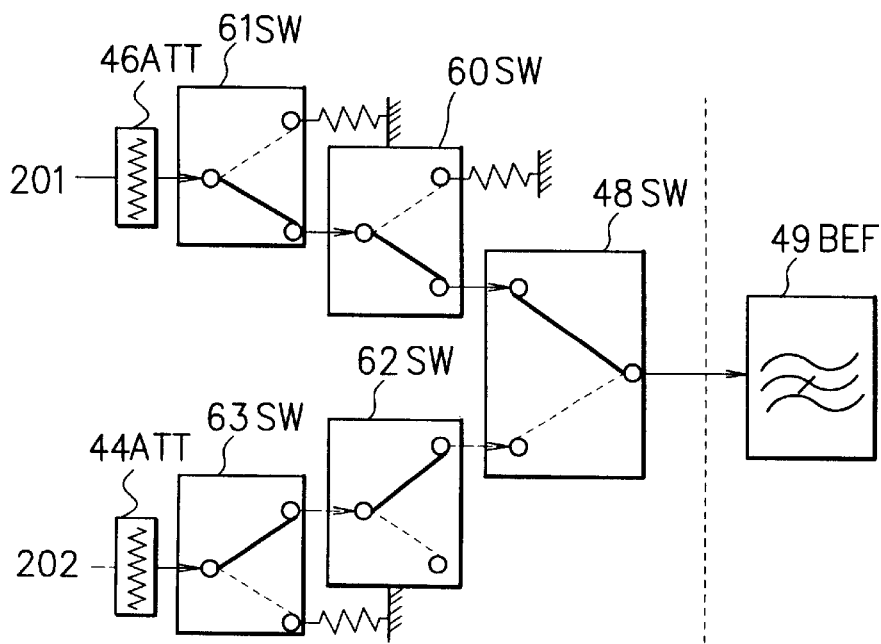

Also in the detector circuit 23 as above, the input signal are received via switches in multiple stages (two stages in this case) from the input terminals 201 and 202 to guarantee isolation between the input terminals 201 and 202. In another embodiments of the detector circuit 23 of the present invention, change-over switches (60 to 69) may be disposed in three or more stages (three stages in this case) as shown in FIG. 5B. Alternatively, as can be seen from FIG. 6B, isolators 66 and 67 may be employed in place of the switches 45 and 47 of FIG. 3. In the structure using a multistage switch configuration, when the number of stages of change-over switches becomes greater, the isolation between the input terminals 201 and 202 is more enhanced in the detector circuit 23.

Description will now be given of operation of the feed-forward amplifier of the embodiment. The multifrequency multiplexed signal of a high frequency band received by the input terminal 1 of FIG. 1 is mixed by the directional coupler 19 with the pilot signal delivered from the output terminal 101 (FIG. 2) of the pilot oscillator 20. The mixed signal is divided by the distributor 2 to be outputted as first and second signals therefrom.

The first signal from the distributor 2 is delivered via the vector adjuster 3 to the main amplifier 4. The amplifier 4 amplifies a signal inputted thereto and outputs an amplified signal therefrom. When any distortion takes place in the signal by the amplification, the output signal includes an amplified input signal component (to be simply referred to an input signal component) and a distorted signal component. The coupler 7 separates a part of the signal including the input signal component and the distorted signal component and feeds the separated signal to the coupler 8.

The second signal outputted from the distributor 2 is sent via the delay line 6 to the coupler 8. The second signal is delayed by the delay line 6 to have a phase opposite to that of the signal received from the coupler 7. Only the delay line 6 exists between an output terminal of the second signal of the distributor 2 and the coupler. Distortion occurring in the delay line 6 is therefore negligible. As above, a part of the mixed signal from the coupler 8 is separated by the coupler 10 to be fed to the detector circuit 23.

In the detector circuit 23, the mixed signal is received via the input terminal 201. The detector circuit 23 detects the pilot signal in the mixed signal and feeds the pilot signal to the controller 14. On receiving the pilot signal, the controller 14 controls, to minimize a signal level of the pilot signal from the detector circuit 23, the vector adjuster 3 to adjust quantity of attenuation and phase. When the distortion detecting loop A appropriately operates, the coupler 8 outputs only the distorted signal component caused by the amplification of the main amplifier 4.

Next, operation of the distortion removing loop B will be described. By switching operations, the pilot oscillator 20 outputs a signal via the output terminal 102, and the detector circuit 23 receives an input signal via the input terminal 202 in this situation.

Since the pilot oscillator 20 delivers an output signal via the output terminal 102, the pilot signal is mixed by the coupler 21 with an output signal from the vector adjuster 3, the output signal being appropriately adjusted in magnitude of attenuation and phase. The mixed signal is mixed by the coupler 8 with the signal received via the delay line 6, the signals having mutually opposite phases. Resultantly, the coupler 8 outputs to the vector adjuster 13 a signal including a distorted signal component and a pilot signal component. The signal including the distorted and pilot signal components is adjusted in magnitude of attenuation and phase and is then delivered to the subordinate amplifier 15. The amplifier 15 amplifies the signal to output an amplified signal to the coupler 12.

The signal including the input signal component, the distorted signal component, and the pilot signal component outputted from the main amplifier 4 is fed via the delay line 11 to the coupler 12. The signal is delayed by the delay line 11 to have a phase opposite to that of another signal delivered to the coupler 12.

A signal resultant from the mixing operation by the coupler 12 is fed to the coupler 16. A part of the signal is separated by the coupler 16 to be inputted to the detector circuit 23. The detector 23 simultaneously detects the signal including the input signal component, the distorted signal component, and the pilot signal component received from the input terminal 202 to extract the pilot signal component from the input signal and then delivers the pilot signal via the output terminal 204 to the controller 14. The controller 14 controls, to minimize a signal level of the pilot signal component from the detector 23, the vector adjuster 13 to adjust magnitude of attenuation and phase.

As above, The controller 14 controls the vector adjuster 13 to minimize a signal level of the pilot signal component, and the signal delivered via the subordinate amplifier 15 is mixed by the coupler 12 with the signal propagated through the delay line 11, the signals having the opposite phases. Resultantly, the output terminal 17 delivers therefrom an amplified signal including the minimized pilot signal component, namely, an amplified signal in which the distorted signal component is minimized.

In the operations of the distortion detecting loop A and the distortion removing loop B in accordance with the present invention, the pilot oscillator 20 changes over the pilot signal output between the output terminals 101 and 102 at a predetermined timing, and the detector circuit 23 conducts a change-over of the mixed signal input between the input terminals 201 and 202 at a predetermined timing. Therefore, the loops A and B can share the pilot oscillator 20 and the detector circuit 23 therebetween.

The change-over of the output signal in the pilot oscillator 20 and that of the input signal in the detector circuit 23 are controlled by control signals from the controller 14, the signals having the same phase. The change-over is conducted in the pilot oscillator 20 and the detector circuit 23 in a time-sharing manner.

Specifically, the change-over operations are achieved between the output terminals 101 and 102 of the pilot oscillator 20 and between the input terminals 201 and 202 of the detector circuit as follows. The operation in which the output from the pilot oscillator 20 is changed over to the output terminal 101 and the input of the detector 23 is changed over to the input terminal 201 and the operation in which the output from the pilot oscillator 20 is changed over to the output terminal 102 and the input of the detector 23 is changed over to the input terminal 202 are alternately achieved in a time-sharing fashion.

Referring next to FIGS. 2 and 3, description will be given of the output change-over by the pilot oscillator 20 and the input change-over by the detector 23. When the pilot oscillator 20 delivers a pilot signal from the output terminal 101, the switch 32 selects the switch 33, the switch 33 is set to the output terminal 101, and the switch 35 is connected to ground under supervision of the controller 14 as shown in FIG. 2.

When the pilot oscillator 20 delivers a pilot signal from the output terminal 102, the switch 32 is set to the switch 35, the switch 35 selects the output terminal 102, and the switch 33 is connected to ground under control of the controller 14.

When the detector 23 receives the signal including the input signal component, the distorted signal component, and the pilot signal component from the input terminal 201, the switch 47 is set to a terminal for the switch 48 and the switch 48 is connected to a terminal for the switch 47 under supervision of the controller 14 as shown in FIG. 3.

When the signal including the input signal component, the distorted signal component, and the pilot signal component is fed from the input terminal 202, the switch 45 is set to a port for the switch 48, the switch 48 is connected to a port for the switch 45, and the switch 47 selects ground under supervision of the controller 14.

Referring now to FIGS. 7 to 10, description will be concretely given of an example of operation of the feedforward amplifier of the embodiment in accordance with the present invention.

The pilot signals from the output terminals 101 and 102 are adjusted to appropriate levels by the attenuators 34 and 36 to be outputted therefrom. Assume that the levels of the pilot signals from the output terminals 101 and 102 are respectively −20 dBm and −30 dBm in this embodiment.

Assume further that losses in the directional coupler 19 and the directional couplers 7, 8, 10, 16, and 21 respectively take values of 30 dB, 30 dB, 20 dB, 20 dB, 30 dB, and 20 dB. Each of the main and subordinate amplifiers 4 and 15 is assumed to have gains of 50 dB.

First, operation of the distortion detecting loop A will be described. The input terminal 1 receives an input signal, e.g., a signal of −13.5 dBm shown in FIG. 7(1). The input signal is coupled by the directional coupler 19 with an output signal, e.g., a signal of −20 dBm shown in FIG. 7(2). The coupler 19 outputs a mixed signal (FIG. 7(3)) including the −13.5 dBm signal and a pilot signal component of −50 dBm to the two-output distributor 2.

The distributor 2 outputs a signal including a signal component of −16.5 dBm and a pilot signal component of −53 dBm to the vector adjuster 3 and the delay line 6 as shown in (4) and (5) of FIG. 7. The vector adjuster 3 delivers the signal (FIG. 7(4) to the main amplifier 4.

In this embodiment, since the pilot oscillator 20 has a two-stage switch layout (of, for example, a transfer switch), when the pilot oscillator 20 produces a pilot signal of about 2 GHz, isolation can be guaranteed for about 60 dB between the output terminals 101 and 102. Therefore, in the operation of the distortion detecting loop A in which the output of the pilot oscillator 20 is coupled with the output terminal 101, i.e., with the directional coupler 19, the output terminal 102 receives a leakage signal of the pilot signal at a level of −80 dBm (FIG. 7(6)).

Although the leakage signal of the pilot signal component has a frequency equal to that of the pilot signal component, FIGS. 7 to 10 show the inherent pilot signal component and the leakage signal component thereof with a solid line and a dotted line at respective positions.

The coupler 21 mixes the signal of FIG. 7(4) with that of FIG. 7(6) to produce a signal including a −16.5 dBm input signal component, a −53 dBm pilot signal component, and a −100 dBm leakage pilot signal component as shown in FIG. 7(7). This signal is fed to the main amplifier 4.

Figure 8:
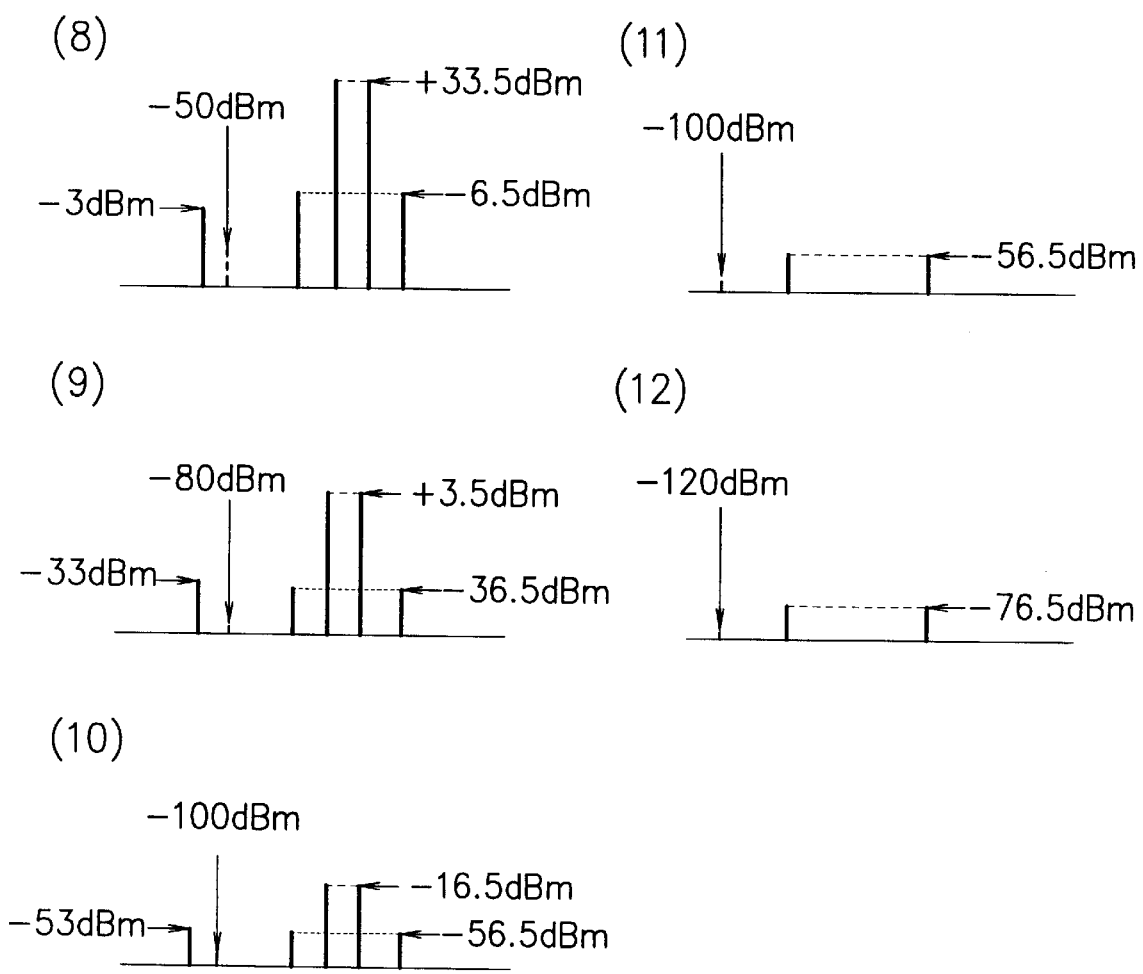
FIG. 8 is a second power waveform graph for explaining operation of the first embodiment of the feedforward amplifier.

The main amplifier A amplifies the signal of FIG. 7(7) to obtain a signal including a +33.5 dBm input signal component, a −3 dBm pilot signal component, a −50 dBm leakage pilot signal component, and a −6.5 dBm distorted signal component appearing due to the amplification of the main amplifier 4 as shown in FIG. 8(8). The signal is delivered from the main amplifier 4. It is assumed that the distortion in the main amplifier 4 is represented as 40 dB.

The output signal of FIG. 8(8) is fed to the coupler 7. The coupler 7 separates a part of the signal. The separated signal includes a +3.5 dBm input signal component, a −33 dBm pilot signal component, a −80 dBm leakage pilot signal component, and a −36.5 dBm distorted signal component as shown in FIG. 8(9).

The signal is outputted from the coupler 7 to the coupler 8. As shown in FIG. 8(10), the signal includes a −16.5 dBm input signal component, a −53 dBm pilot signal component, a −100 dBm leakage pilot signal component, and a −56.5 dBm distorted signal component.

The coupler 8 receives another signal, i.e., a signal via the delay line 6 from the distributor 2 shown in FIG. 7(5). The coupler 8 mixes the signal of FIG. 7(5) and the signal of FIG. 8(10) with each other to respectively cancel the input signal components and the pilot signal components of these signals. The resultant signal includes a −56.5 dBm distorted signal component and a −100 dBm leakage pilot signal component as shown in FIG. 8(11).

The signal of FIG. 8(11) is fed to the coupler 10. The coupler 10 separates a part of the received signal and delivers the separated signal to the detector circuit 23. As can be seen from FIG. 8(12), the signal includes a −76.5 dBm distorted signal component and a −120 dBm leakage pilot signal component.

The leakage pilot signal component has a frequency equal to that of the pilot signal component. Therefore, the detector 23 detects also the −120 dBm leakage pilot signal shown in the signal of FIG. 8(12). Inherently, the controller 14 supervises the vector adjuster 3 to minimize the pilot signal component. However, since the detector 23 detects also the leakage pilot signal, the controller 14 controls the vector adjuster to minimize also the leakage pilot signal component. This disadvantageously causes an error.

As shown in FIG. 7 and other figures, the leakage pilot signal component has a signal level lower by 47 dB than the original pilot signal component. Assume that the original pilot signal component has magnitude of one. Then, the leakage pilot signal component has magnitude of $1.995 \times 10^{-5}$. This consequently leads to an error of 0.00017 dB in the adjustment of attenuation by the vector adjuster 3.

For simplification of explanation, description will be given only of an amplitude error rate and an amount of improvement corresponding to the amplitude error rate. Namely, methods of calculating the error rate (amplitude error rate) and the amount of improvement will not be described.

Operation of the distortion removing loop B will be next described. In the operation of the loop B, the pilot oscillator 20 outputs a pilot signal from the output terminal 102, i.e., to the coupler 21. The signal is adjusted to a level of −30 dBm by the attenuator 36. In this situation, the output terminal 101 receives a leakage pilot signal at a level of −90 dBm.

Therefore, the main amplifier 4 produces a signal including a 0 dBm pilot signal component, an input signal component, a leakage pilot signal component, and a distorted signal component. Each of the signals excepting the pilot signal component varies depending on the adjustment of magnitudes of attenuation and phase independently by the vector adjuster 3. It is assumed in this case as shown in FIG. 9(13) that the input signal component is at +33.5 dBm, the leakage pilot signal component is at −73 dBm, and the distorted signal component is at −6.5 dBm.

The signal of FIG. 9(13) from the main amplifier 4 is outputted to the delay line 11 and the coupler 7. The coupler 7 separates a part of the signal and sends the separated signal to the coupler 8. The signal is mixed by the coupler 8 with another signal received via the delay line 6, the signals having mutually opposite phases. The mixed signal is adjusted in amounts of attenuation and phase by the vector adjuster 13 to be outputted to the subordinate amplifier 15. The signal components fed to the subordinate amplifier 15 varies in the signal level from each other. It is assumed in this situation that the signal delivered to the subordinate amplifier 15 includes a pilot signal component at a level of −50 dBm, a leakage pilot signal component at −123 dBm, and a distorted signal component at −56.5 dBm as shown in FIG. 9(14).

The signal (FIG. 9(14)) received by the subordinate amplifier 15 is amplified to be fed to the coupler 12. The amplified signal includes a 0 dBm pilot signal component, a −73 dBm leakage pilot signal component, and −6.5 dBm distorted signal component.

The signal of FIG. 9(15) from the subordinate amplifier 15 is mixed with the coupler 12 with another signal (FIG. 9(13)) fed via the delay line 11, the signal having mutually opposite phases. The mixed signal from the coupler 12 includes a +33.5 dBm input signal component and a leakage pilot signal component as shown in FIG. 9(16).

The vector adjusters 3 and 13 have mutually different amounts of attenuation and phase to cancel pilot signal components by the respective distorted detecting and removing loops A and B. The leakage pilot signal component has a signal level which varies depending on the adjustment of the magnitudes of attenuation and phase by the vector adjusters 3 and 13 to cancel the pilot signal component. In this embodiment, it is assumed that the level of the leakage pilot signal component takes a maximum value of −70 dBm.

The signal of FIG. 9(16) is fed to the coupler 16. The coupler 16 separates a part of the signal to input the separated signal to the detector 23. The signal includes a +3.5 dBm input signal component and a leakage pilot signal component of which the maximum value is −100 dBm as shown in FIG. 9(17).

The leakage pilot signal component is 73 dB lower than the original pilot signal component. Assuming that the pilot signal component has magnitude of one, the leakage pilot signal component has magnitude of $5.0 \times 10^{-8}$. Therefore, the adjustment of attenuation by the vector adjuster 3 leads to an error of $4.4 \times 10^{-7}$ dB.

Description has been given of the error in each of the distortion detecting and removing loops A and B when the pilot oscillator 20 includes a multistage change-over switch layout. However, the present invention may also applicable when the detector circuit 23 includes a multistage input change-over configuration. Description will now be given of an error appearing in operation of each of the distortion detecting and removing loops A and B when the detector circuit 23 includes a multistage input change-over layout as well as quantity of improvement of the error.

In the distortion detecting loop A, the signal (FIG. 8(8)) propagating through the delay line 11 is mixed by the couple 12 with the signal (FIG. 9(15)) outputted from the vector adjuster 13. For the leakage pilot signal component of the signal shown in FIG. 9(15), consideration has already been given to an error caused by the operation of the distortion detecting loop A when the pilot oscillator 20 includes a multistage change-over switch configuration. Therefore, the signal component is negligible.

Figure 10:
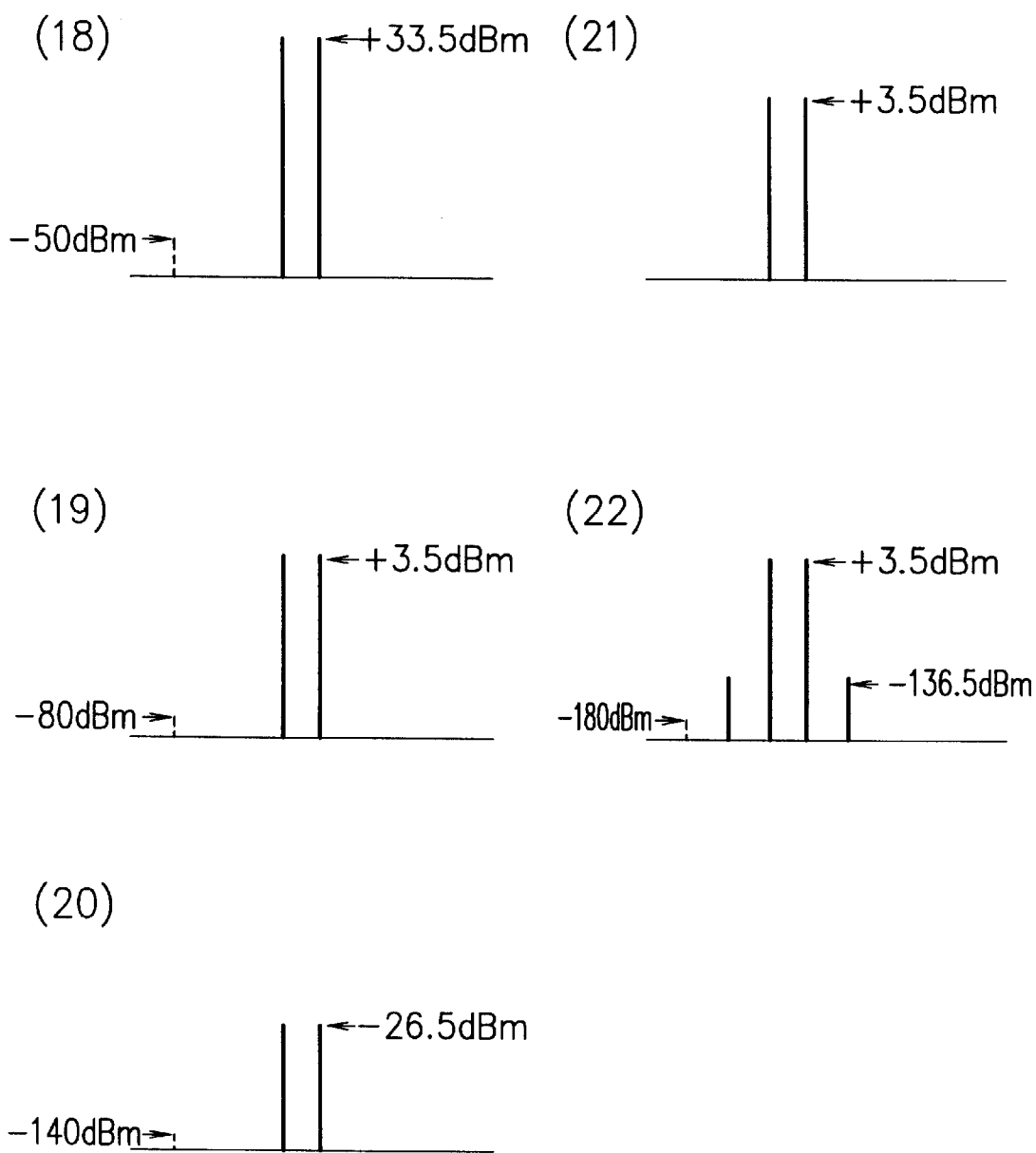
FIG. 10 is a fourth power waveform graph for explaining operation of the first embodiment of the feedforward amplifier.

Consequently, the signal from the coupler 12 to the coupler 16 includes a +33.5 dBm input signal component and a −50 dBm leakage pilot signal component as shown in FIG. 10(18). The coupler 16 separates a part of the signal to send the signal to the vector adjuster 23. As shown in FIG. 10(19), the signal from the coupler 16 includes a +3.5 dBm input signal component and a −80 dBm leakage pilot signal component.

The coupler 16 feeds the signal (FIG. 10(19)) via the input terminal 202 to the vector adjuster 13. The detector 23 is configured in a two-stage change-over switch layout. For a signal of about 2 GHz, isolation of 60 dB can be therefore guaranteed between the input terminals 201 and 202. The input terminal 201 receives a leakage signal component of each signal component of FIG. 10(19). The leakage signal component has a level reduced by 60 dB as compared with the original signal component. As shown in FIG. 10(20), the leakage signal to the input terminal 201 includes a −56.5 dBm input signal component and −140 dBm leakage pilot signal component. The signal is mixed with the signal shown in FIG. 8(12) to be delivered to the input terminals 201.

Since the leakage pilot signal component is 67 dB lower than the original pilot signal component, any error caused by the leakage pilot signal component is negligible.

In the distortion removing loop B, the vector adjuster 23 receives the signal (FIG. 9(17)) from the coupler 16. For the leakage pilot signal component of the signal of FIG. 9(17), consideration has already been given to an error taking place through the operation of the distortion removing loop B when the pilot oscillator 20 includes a multistage change-over switch configuration. Consequently, the signal component can be ignored.

Therefore, the signal from the coupler 16 to the vector adjuster 13 includes a +3.5 dBm input signal component as shown in FIG. 10(21). The signal of FIG. 10(21) is fed via the input terminal 202 to the detector 23 while the signal of FIG. 8(12) is being delivered to the input terminal 201. Resultantly, the input terminal 202 receives a leakage signal component of each signal component shown in FIG. 8(12), the leakage signal component having a signal level lower by 60 dB than the original signal component.

As can be seen from FIG. 10(22), the signal from the input terminal 202 to the detector 23 therefore includes a +3.5 dBm input signal component, a −180 dBm leakage pilot signal component, and a −136.5 dBm distorted signal component.

Since the leakage pilot signal component is 163 dB lower than the original pilot signal component, any error caused by the leakage pilot signal component is also negligible in the operation of the distortion removing loop B.

The distortion caused by the main amplifier 4 is at most about 30 dB to about 35 dB. It is also necessary to consider reduction in the improvement by an error due to a frequency characteristic of the main amplifier 4, adjusting sensitivity of the vector adjusters 3 and 13, and detecting sensitivity of the detector circuit 23.

Figure 11:
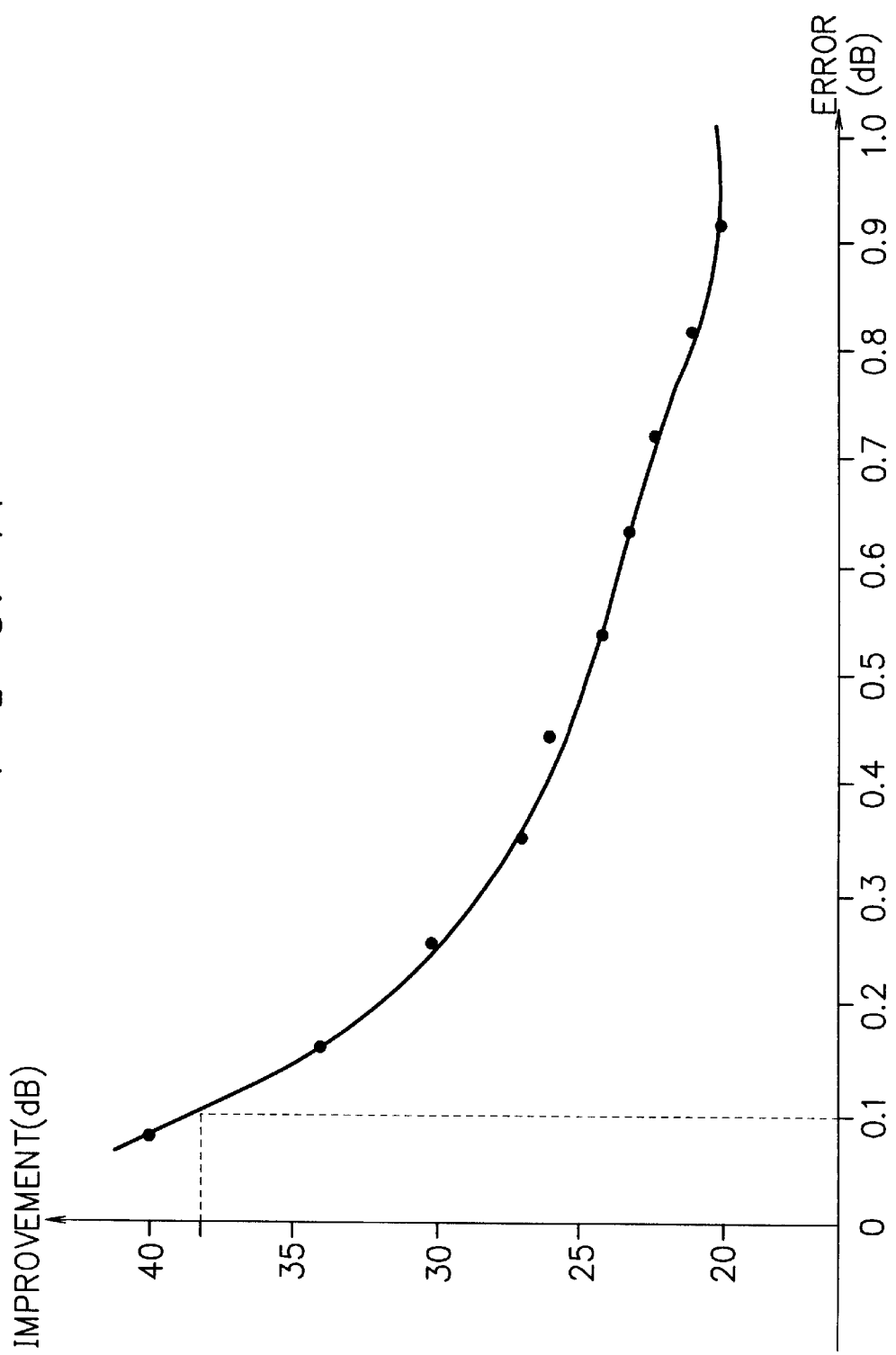
FIG. 11 is a graph showing a relationship between an adjusting error (amplitude error) in a vector adjuster due to a leaked pilot signal input and improvement associated with the adjusting error.

FIG. 11 shows a relationship between the error and the improvement in a graph. Referring to the graph of FIG. 11, the error of the overall circuit system is desirably at most 0.1 dB in consideration of the distortion and the reduction in the improvement by an error due to a frequency characteristic of the main amplifier 4, adjusting sensitivity of the vector adjusters 3 and 13, and detecting sensitivity of the detector circuit 23. In the embodiment above, the total error caused by the leakage pilot signal components in the distortion detecting and removing loops A and B is about 0.00017 dB. That is, the error in the overall circuit system is satisfactorily minimized.

For the distortion detecting loop A, the improvement is actually calculated as 94 dB. The improvement is actually attained as 146 dB for the distortion removing loop B. The distortion occurring in the entire circuit system can be advantageously removed in an ideal manner.

Description will now be given of the error and the improvement in the distortion detecting and removing loops A and B in the same configuration and under the same condition as above excepting that the pilot oscillator 20 includes a one-stage change-over switch and the detector circuit 23 includes a one-stage change-over switch.

The output change-over switch of the pilot oscillator 20 is constructed in one stage. Therefore, for a signal of 2 GHz, isolation is guaranteed only for 30 dB between the output terminals 101 and 102. Each leakage pilot signal component shown in FIGS. 7 to 10 becomes higher in the signal level by 30 dB.

In FIGS. 7 to 8, each leakage pilot signal component is 17 dB lower than the original pilot signal component, and hence the error appearing in the operation of the distortion detecting loop A is 0.17506 dB. Since each leakage pilot signal component of FIG. 9(13) to FIG. 9(17) is 43 dB lower than the original pilot signal component, an error of 0.00044 dB takes place in the operation of the distortion removing loop B.

When the input change-over switch of the detector 23 is configured in one stage, isolation is guaranteed also about 30 dB between the output terminals 101 and 102. Each leakage pilot signal component shown in FIG. 10 becomes higher in the signal level by 60 dB.

Since each leakage pilot signal component shown in FIG. 10(18) to FIG. 10(21) is 7 dB lower than the original pilot signal component, the error caused by in the operation of the distortion removing loop B is 1.58 dB. In FIG. 10(22), the leakage pilot signal component is 93 dB lower than the original pilot signal component, and hence the error appearing in the operation of the distortion removing loop B can be neglected.

Consequently, the total error occurring in the operation of the distortion detecting loop A is 1.75506 dB and that of the distortion removing loop B is 0.00044 dB. The values of improvement for the distortion detecting and removing loops A and B are obtained as 12.9981 dB and 86 dB. In the overall circuit system, there exist the error caused by the leakage pilot signal components as will as the error due to a frequency characteristic of the main amplifier 4, adjusting sensitivity of the vector adjusters 3 and 13, and detecting sensitivity of the detector circuit 23. Therefore, when an error of 1.76 dB occurs due to the leakage pilot signal components, the system cannot obtain the improvement to detect and to remove the distorted signals.

Description has been given of an embodiment in accordance with the present invention in which the output change-over unit of the pilot oscillator 20 and the input change-over unit of the detector circuit 23 are configured in a multistage layout. However, as can be seen from FIGS. 6A and 6B, similar advantageous results can be obtained by an alternative embodiment of the present invention in which each of the output input change-over units includes an isolator.

In accordance with the present invention as described above, there is provided a feedforward amplifier in a simplified circuit construction in which a distortion detecting loop and a distortion removing loop share a pilot oscillator and a controller therebetween. By guaranteeing sufficient isolation between the outputs from the pilot oscillator and between the inputs to the controller, leakage signals can be suppressed between the outputs and between the inputs. This results in satisfactory improvement to remove the distorted signals.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A feedforward amplifier, comprising:
   a main amplifier,
   a distortion detecting loop for detecting a nonlinear distorted signal component appearing due to amplification of a multifrequency input signal by said main amplifier and
   a distortion removing loop for removing a distorted signal component from the multifrequency input signal amplified by said main amplifier, according to the distorted signal component detected by said distortion detecting loop;
   a pilot signal oscillating means for alternately outputting a pilot signal for a detecting operation of a distorted signal component of said distortion detecting loop and a removing operation of a distorted signal component of said distortion removing loop; and
   a detecting means for alternately receiving mixed signals from said distortion detecting loop and said distortion removing loop and detecting a pilot signal component in the mixed signals received from said loops, wherein:
   said pilot signal oscillating means includes output change-over means for outputting the pilot signal to either one of said distortion detecting loop and said distortion removing loop, said output change-over means including a multistage change-over switch; and
   said detecting means includes input change-over means for receiving the mixed signal from either one of said distortion detecting loop and said distortion removing loop, said input change-over means including a multistage change-over switch.

2. A feedforward amplifier in accordance with claim 1, wherein said input change-over means comprises:
   first change-over switch in a preceding stage disposed for each pair of two input terminals of said detecting means for connecting the input signal to an input terminal of a change-over switch in a preceding stage or to ground; and
   a second change-over switch disposed in a succeeding stage of said first change-over switch in the preceding stage for connecting one of outputs from said change-over switch in the preceding stage to an input terminal of said detecting means.

3. A feedforward amplifier in accordance with claim 1, wherein said input change-over means comprises:
   first change-over switch disposed for each pair of two input terminals of said detecting means for connecting the signal inputted thereto to an input terminal of a change-over switch in a subsequent stage or to ground;
   at least one stage of a second change-over switch disposed for each pair of two output terminals of said first change-over switch for connecting a signal inputted from said first change-over switch to an input of a change-over switch in a succeeding stage or to ground; and
   a third change-over switch for connecting either one of outputs from said second change-over switch to an input terminal of said detecting means.

4. A feedforward amplifier in accordance with claim 1, wherein said change-over switches include transfer switches.

5. A feedforward amplifier in accordance with claim 1, wherein said pilot signal oscillator means produces a pilot signal having a frequency of about 2 GHz.

6. A feedforward amplifier in accordance with claim 1, wherein said pilot signal is a signal having a single frequency.

7. A feedforward amplifier, comprising:
   a main amplifier,
   a distortion detecting loop for detecting a nonlinear distorted signal component appearing due to amplification of a multifrequency input signal by a main amplifier and a distortion removing loop for removing a distorted signal component from the multifrequency input signal amplified by said main amplifier, according to the distorted signal component detected by said distortion detecting loop;

a pilot signal oscillating means for alternately outputting a pilot signal for a detecting operation of a distorted signal component of said distortion detecting loop and a removing operation of a distorted signal component of said distortion removing loop; and a detecting means for alternately receiving mixed signals from said distortion detecting loop and said distortion removing loop and detecting a pilot signal component in the mixed signals received from said loops, wherein:

said pilot signal oscillating means includes output change-over means for outputting the pilot signal to either one of said distortion detecting loop and said distortion removing loop, said output change-over means including a multistage change-over switch;

said detecting means includes input change-over means for receiving the mixed signal from either one of said distortion detecting loop and said distortion removing loop, said input change-over means including a multi-stage change-over switch and;

said output change-over means comprises:

a first change-over switch for connecting the pilot signal to either one of two output terminals;

at least one stage of a second change-over switch disposed for each pair of two output terminals of said first change-over switch for connecting the pilot signal delivered from said first change-over switch to an input of a change-over switch in a succeeding stage or to ground; and a third change-over switch disposed for each pair of two output terminals of said second change-over switch for connecting the pilot signal fed from said second change-over switch to an output terminal of said pilot signal oscillating means or to ground.

8. A feedforward amplifier in accordance with claim 7, wherein said input change-over means comprises:

first change-over switch in a preceding stage disposed for each pair of two input terminals of said detecting means for connecting the input signal to an input terminal of a change-over switch in a preceding stage or to ground; and a second change-over switch disposed in a succeeding stage of said first change-over switch in the preceding stage for connecting one of outputs from said change-over switch in the preceding stage to an input terminal of said detecting means.

9. A feedforward amplifier in accordance with claim 7, wherein said input change-over means comprises:

first change-over switch disposed for each pair of two input terminals of said detecting means for connecting the signal inputted thereto to an input terminal of a change-over switch in a subsequent stage or to ground;

at least one stage of a second change-over switch disposed for each pair of two output terminals of said first change-over switch for connecting a signal inputted from said first change-over switch to an input of a change-over switch in a succeeding stage or to ground; and a third change-over switch for connecting either one of outputs from said second change-over switch to an input terminal of said detecting means.

10. A feedforward amplifier in accordance with claim 7, wherein said change-over switches include transfer switches.

11. A feedforward amplifier in accordance with claim 7, wherein said pilot signal oscillator means produces a pilot signal having a frequency of about 2 GHz.

12. A feedforward amplifier in accordance with claim 7, wherein said pilot signal is a signal having a single frequency.

13. A feedforward amplifier, comprising a main amplifier, a distortion detecting loop for detecting a nonlinear distorted signal component appearing due to amplification of a multifrequency input signal by a main amplifier and a distortion removing loop for removing a distorted signal component from the multifrequency input signal amplified by said main amplifier, according to the distorted signal component detected by said distortion detecting loop;

a pilot signal oscillating means for alternately outputting a pilot signal for a detecting operation of a distorted signal component of said distortion detecting loop and a removing operation of a distorted signal component of said distortion removing loop; and a detecting means for alternately receiving mixed signals from said distortion detecting loop and said distortion removing loop and detecting a pilot signal component in the mixed signals received from said loops, wherein:

said pilot signal oscillating means includes output change-over means for outputting the pilot signal to either one of said distortion detecting loop and said distortion removing loop, said output change-over means including a multistage change-over switch;

said detecting means includes input change-over means for receiving the mixed signal from either one of said distortion detecting loop and said distortion removing loop, said input change-over means including a multi-stage change-over switch; and said output change-over means comprises:

a change-over switch in a preceding stage for connecting an output of the pilot signal to either one of two output terminals; and a change-over switch in a succeeding stage disposed for each pair of the two output terminals of said second change-over switch in the preceding stage for connecting the pilot signal outputted from the change-over switch in the preceding stage to an output terminal of said pilot signal oscillating means or to ground.

14. A feedforward amplifier in accordance with claim 13, wherein said input change-over means comprises:

first change-over switch in a preceding stage disposed for each pair of two input terminals of said detecting means for connecting the input signal to an input terminal of a change-over switch in a preceding stage or to ground; and a second change-over switch disposed in a succeeding stage of said first change-over switch in the preceding stage for connecting one of outputs from said change-over switch in the preceding stage to an input terminal of said detecting means.

15. A feedforward amplifier in accordance with claim 13, wherein said input change-over means comprises:

first change-over switch disposed for each pair of two input terminals of said detecting means for connecting the signal inputted thereto to an input terminal of a change-over switch in a subsequent stage or to ground;

at least one stage of a second change-over switch disposed for each pair of two output terminals of said first change-over switch for connecting a signal inputted from said first change-over switch to an input of a change-over switch in a succeeding stage or to ground; and a third change-over switch for connecting either one of outputs from said second change-over switch to an input terminal of said detecting means.

16. A feedforward amplifier in accordance with claim 13, wherein said change-over switches include transfer switches.

17. A feedforward amplifier in accordance with claim 13, wherein said pilot signal oscillator means produces a pilot signal having a frequency of about 2 GHz.

18. A feedforward amplifier in accordance with claim 13, wherein said pilot signal is a signal having a single frequency.

19. A feedforward amplifier, comprising:

a main amplifier;

a distortion detecting loop for detecting a nonlinear distorted signal component appearing through amplification of a multifrequency input signal by said main amplifier;

a distortion removing loop for removing a distorted signal component from the multifrequency input signal amplified by said main amplifier, according to the distorted signal component detected by said distortion detecting loop;

pilot signal oscillating means for alternately outputting a pilot signal for a detecting operation of a distorted signal component of said distortion detecting loop and a removing operation of a distorted signal component of said distortion removing loop; and detecting means for alternately receiving a mixed signal from said distortion detecting loop and said distortion removing loop and detecting a pilot signal component in the mixed signal received from said loops, wherein:

said pilot signal oscillating means includes output change-over means for outputting the pilot signal to either one of said distortion detecting loop and said distortion removing loop;

said output change-over means is disposed for each pair of two output terminals of said pilot signal oscillating means and includes an isolator to guarantee isolation between the two output terminals and a change-over switch disposed in a stage preceding said isolator to connect an output of a pilot signal to either one of said isolators;

said detecting means includes input change-over means for receiving the mixed signal from either one of said distortion detecting loop and said distortion removing loop; and said input change-over means is disposed for each pair of two input terminals of said detecting means and includes an isolator to guarantee isolation between the two input terminals and a change-over switch disposed in a stage succeeding said isolator to connect an output from either one of said isolators to an input terminal of said detecting means.

20. A feedforward amplifier in accordance with claim 19, wherein said change-over switches include transfer switches.

21. A feedforward amplifier in accordance with claim 19, wherein said pilot signal oscillator means produces a pilot signal having a frequency of about 2 GHz.

22. A feedforward amplifier in accordance with claim 19, wherein said pilot signal is a signal having a single frequency.

23. A feedforward amplifier:

a directional coupler for mixing an input multifrequency multiplexed signal inputted thereto with a pilot signal received via a first output terminal of a output change-over means from a pilot signal oscillating means;

a two-output distributor for dividing the mixed signal into tow output signals;

a first vector adjuster for receiving the first output signal from said two-output distributor and for adjusting quantity of phase and quantity of attenuation of the first output signal;

a main amplifier for amplifying an output signal from said first vector adjuster;

a first coupler for separating a part of an amplified signal from said main amplifier and for outputting therefrom the signal separated from the amplified signal;

a first delay line for delaying propagation of a second output signal from said two-output distributor for a propagation time of a signal in said main amplifier and said first vector adjuster;

a second coupler for mixing a signal delayed by the first delay line with a signal received from said first coupler, the delayed signal having a phase opposite to that of the signal received from said first coupler;

a third coupler for separating a part of a mixed signal from said second coupler and for outputting therefrom the signal separated from the mixed signal;

a control circuit for receiving an output signal from said third coupler via a first input terminal of said input change-over means and for controlling quantity of phase and quantity of attenuation in said first vector adjuster, thereby minimizing a level of a pilot signal component detected in said output signal from said third coupler by a detecting means;

a fourth coupler for mixing, after the control operation is conducted for said first vector adjuster by said control circuit, a pilot signal received via a second output terminal of said output change-over means from said pilot signal oscillating means with an output signal from said first vector adjuster;

a second vector adjuster for receiving a signal obtained by mixing by said second coupler a part of a signal attained by amplifying by said main amplifier a mixed signal from said four coupler with a signal delayed by said delay line and received by said second coupler and for adjusting quantity of attenuation and quantity of phase of the signal from said second coupler;

a subordinate amplifier for amplifying an output signal from said second vector adjuster;

a second delay line for delaying propagation of a signal for which a pilot signal have been mixed by said four coupler and which has been outputted from said main amplifier for a propagation time of a signal in said second vector adjuster said subordinate amplifier;

a fifth coupler for mixing a signal delayed by said second delay line and received therefrom with a signal received from said subordinate amplifier, the delayed signal having a phase opposite to that of the signal from said subordinate amplifier, and for outputting a mixed signal resultant from the mixing to an output terminal; and a sixth coupler for separating a part of the signal fed to the output terminal and for outputting the separated signal therefrom, wherein:

said input change-over means receives the output signal from said sixth coupler via a second input terminal; and said control circuit adjusts quantity of attenuation and quantity of phase of said second vector adjuster to minimize a level of a pilot signal component detected by the detecting means in a signal received via a second input terminal.

24. A feedforward amplifier in accordance with claim 23, wherein said change-over switches include transfer switches.

25. A feedforward amplifier in accordance with claim 23, wherein said pilot signal oscillator means produces a pilot signal having a frequency of about 2 GHz.

26. A feedforward amplifier in accordance with claim 23, wherein said pilot signal is a signal having a single frequency.

* * * * *